United States Patent
Dela Pena et al.

(10) Patent No.: US 8,213,121 B2
(45) Date of Patent: Jul. 3, 2012

(54) HGA SUSPENSION PAD BARRIER FOR ELIMINATION OF SOLDER BRIDGING DEFECT

(75) Inventors: Melvin J. A. Dela Pena, Laguna (PH); Edmar C. Escober, Desmarinas Cavite (PH); Sandy E. Joson, Cavite (PH); Teddy T. Tabarangao, Quezon (PH)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 1188 days.

(21) Appl. No.: 11/973,668

(22) Filed: Oct. 9, 2007

(65) Prior Publication Data

US 2009/0091860 A1    Apr. 9, 2009

(51) Int. Cl.
*G11B 21/16* (2006.01)
*G11B 21/24* (2006.01)

(52) U.S. Cl. .................... 360/234.5; 360/294
(58) Field of Classification Search .......... 360/234.5, 360/294
See application file for complete search history.

(56) References Cited

U.S. PATENT DOCUMENTS

| | | | |
|---|---|---|---|
| 4,761,699 A | 8/1988 | Ainslie et al. | |
| 5,200,869 A * | 4/1993 | Matsuzaki | 360/234.5 |
| 5,610,783 A * | 3/1997 | Maffitt et al. | 360/234.5 |
| 5,828,031 A | 10/1998 | Pattanaik | |
| 6,169,253 B1 | 1/2001 | Jairazbhoy et al. | |
| 6,330,132 B1 * | 12/2001 | Honda | 360/234.5 |
| 6,352,881 B1 | 3/2002 | Nguyen et al. | |
| 6,829,818 B2 | 12/2004 | Kamigama et al. | |
| 6,833,509 B2 | 12/2004 | Takahashi | |
| 6,965,499 B1 | 11/2005 | Zhang et al. | |
| 7,064,928 B2 | 6/2006 | Fu et al. | |
| 7,152,303 B2 | 12/2006 | Childers et al. | |
| 7,164,097 B2 | 1/2007 | Shindo et al. | |
| 7,403,357 B1 * | 7/2008 | Williams | 360/245.9 |
| 2003/0070834 A1 * | 4/2003 | Tsuchiya et al. | 174/250 |
| 2003/0141349 A1 | 7/2003 | Liu et al. | |
| 2005/0199680 A1 * | 9/2005 | Matsumoto et al. | 228/101 |
| 2006/0139809 A1 * | 6/2006 | Matsumoto et al. | 360/234.5 |
| 2006/0193084 A1 | 8/2006 | Satoh et al. | |
| 2007/0047144 A1 | 3/2007 | Oosawa | |

OTHER PUBLICATIONS

Ke, Zhang "Value Added Technology Development on Microinterconnect Flex Circuit", *IEEE Transactions on Magnetics Copyright 2003*, (2003),230-234.

* cited by examiner

*Primary Examiner* — Craig A. Renner

(57) ABSTRACT

A method and apparatus for preventing solder bridging. The method includes providing a substrate layer upon which a solder pad is disposed. The method further includes providing a signal conductive layer within the substrate layer. The method also includes forming a solder pad upon the signal conductive layer. The solder pad has a base surface. The method additionally includes forming a barrier portion above the base surface of the solder pad. The barrier portion is for controlling solder flow during a reflow process.

14 Claims, 20 Drawing Sheets

HGA SUSPENSION PAD BARRIER FOR ELIMINATION OF SOLDER BRIDGING DEFECT

TECHNICAL FIELD

This invention relates to the field of hard disk drive development.

BACKGROUND ART

Direct access storage devices (DASD) have become part of everyday life, and as such, expectations and demands continually increase for greater speed for manipulating and for holding larger amounts of data. To meet these demands for increased performance, the mechano-electrical assembly in a DASD device, specifically the Hard Disk Drive (HDD) has evolved to meet these demands.

Advances in magnetic recording heads as well as the disk media have allowed more data to be stored on a disk's recording surface. The ability of an HDD to access this data quickly is largely a function of the performance of the mechanical components of the HDD. Once this data is accessed, the ability of an HDD to read and write this data quickly is primarily a function of the electrical components of the HDD.

A computer storage system may include a magnetic hard disk(s) or drive(s) within an outer housing or base containing a spindle motor assembly having a central drive hub that rotates the disk. An actuator includes a plurality of parallel actuator arms in the form of a comb that is movably or pivotally mounted to the base about a pivot assembly. A controller is also mounted to the base for selectively moving the comb of arms relative to the disk. Integrated lead solder pads on the parallel arms of the actuator comb are connected to an associated integrated lead solder pad on a flex cable. A flex cable commonly includes an actuator electronic (AE) bracket for an electrical and communicative connection between components mounted on the actuator comb and components, devices and controllers of the hard disk drive.

Each actuator arm has extending from it at least one cantilevered electrical lead suspension. A magnetic read/write transducer or head is mounted on a slider and secured to a flexure that is flexibly mounted to each suspension. The read/write heads magnetically read data from and/or magnetically write data to the disk. The level of integration called the head gimbal assembly (HGA) is the head and the slider, which are mounted on the suspension. The slider is usually bonded to the end of the suspension.

A suspension has a spring-like quality, which biases or presses the air-bearing surface of the slider against the disk to cause the slider to fly at a precise distance from the disk. Movement of the actuator by the controller causes the head gimbal assemblies to move along radial arcs across tracks on the disk until the heads settle on their set target tracks. The head gimbal assemblies operate in and move in unison with one another or use multiple independent actuators wherein the arms can move independently of one another.

To allow more data to be stored on the surface of the disk, more data tracks must be stored more closely together. The quantity of data tracks recorded on the surface of the disk is determined partly by how well the read/write head on the slider can be positioned and made stable over a desired data track. Vibration or unwanted relative motion between the slider and surface of disk will affect the quantity of data recorded on the surface of the disk.

To mitigate unwanted relative motion between the slider and the surface of the disk, HDD manufacturers have implemented a secondary actuator in close proximity to the slider. A secondary actuator of this nature is generally referred to as a microactuator because it typically has a very small actuation stroke length, typically plus and minus 1 micron. A microactuator typically allows faster response to relative motion between the slider and the surface of the disk as opposed to moving the entire structure of actuator assembly.

During processes for assembly of the hard disk drive, soldering processes are performed on integrated lead solder pads of hard disk drive components for electronically and communicatively intercoupling components in an assembly and/or an assembly to controlling electronics of the hard disk drive. In hard disk drives and most electronic devices with micron-sized components and associated leads, lead to lead connections may be susceptible to solder bridging during soldering processes.

SUMMARY OF THE INVENTION

A method and apparatus for solder bridging elimination in an electronic device is described.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to embodiment(s) of the present invention. While the invention will be described in conjunction with the embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, and components have not been described in detail as not to unnecessarily obscure aspects of the present invention.

The discussion will begin with an overview of a hard disk drive and components connected within. The discussion will then focus on embodiments of the invention that provide a solder pad with a barrier for reducing instances of solder bridging during a solder reflow process performed components disposed therein. Finally, fabrication of solder pad with a barrier will be discussed.

Although embodiments of the solder pad will be described in a microactuator, it is understood that the embodiments described herein are useful outside of the art of microactuators, such as devices having an interconnect in which a soldering or solder reflow process is performed thereon. The utilization of solder pad in a microactuator is only one embodiment and is provided herein merely for purposes of brevity and clarity.

OVERVIEW

Figure 1:
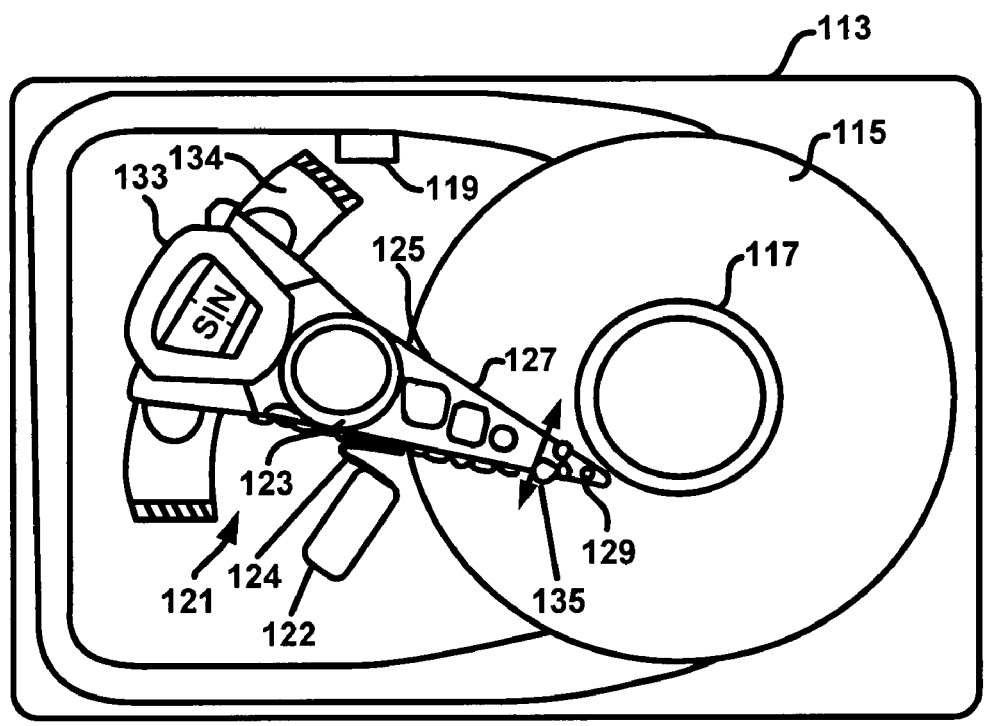
FIG. 1 is plan view of an HDD in accordance with an embodiment of the present invention.

With reference now to FIG. 1, a schematic drawing of an embodiment of an information storage system comprising a magnetic hard disk file or drive 111 for a computer system is shown. Drive 111 has an outer housing or base 113 containing a disk pack having at least one media or magnetic disk 115. Although not shown in FIG. 1, it is noted that there is an appropriately configured (mated) cover for disposition upon outer housing 113, such that when the cover is in place, a sealed HDD exists. A spindle motor assembly having a central drive hub 117 rotates the disk or disks 115. An actuator 121 comprises a plurality of parallel actuator arms (one shown) in the form of an actuator comb assembly 125 that is movably or pivotally mounted to base 113 about a pivot assembly 123. A controller 119 is also mounted to base 113 for selectively moving actuator comb assembly 125 relative to disk 115.

In the embodiment shown, each parallel arm of actuator comb assembly 125 has extending from it at least one cantilevered electrical lead suspension (ELS) 127. The ELS may be any form of lead suspension that can be used in a Data Access Storage Device, such as a HDD. A magnetic read/write transducer or head is mounted on a slider 129 and secured to a flexure that is flexibly mounted to each ELS 127. The read/write heads magnetically read data from and/or magnetically write data to disk 115. The level of integration called the head gimbal assembly is the head and the slider 129, which are mounted on suspension (also referred to as a flexure) 127. The slider 129 is usually bonded to the end of ELS 127.

ELS 127 has a spring-like quality, which biases or presses the air-bearing surface of the slider 129 against the disk 115 to cause the slider 129 to fly at a precise distance from the disk. ELS 127 has a hinge area that provides for the spring-like quality, and a flexing interconnect (or flexing interconnect) that supports read and write traces through the hinge area. A voice coil 133, free to move within a conventional voice coil motor magnet assembly 134 (top pole not shown), is also mounted to arms 125 opposite the head gimbal assemblies. Movement of the actuator 121 (indicated by arrow 135) by controller 119 causes the head gimbal assemblies to move along radial arcs across tracks on the disk 115 until the heads settle on their set target tracks. The head gimbal assemblies operate in a conventional manner and move in unison with one another, unless drive 111 uses multiple independent actuators (not shown) wherein the arms can move independently of one another.

Also shown in FIG. 1 is a flex cable 124, having coupled therewith an actuator electronics (AE) bracket 122, that is attached to actuator comb assembly 125 in accordance with embodiments of the present invention.

Figure 2:
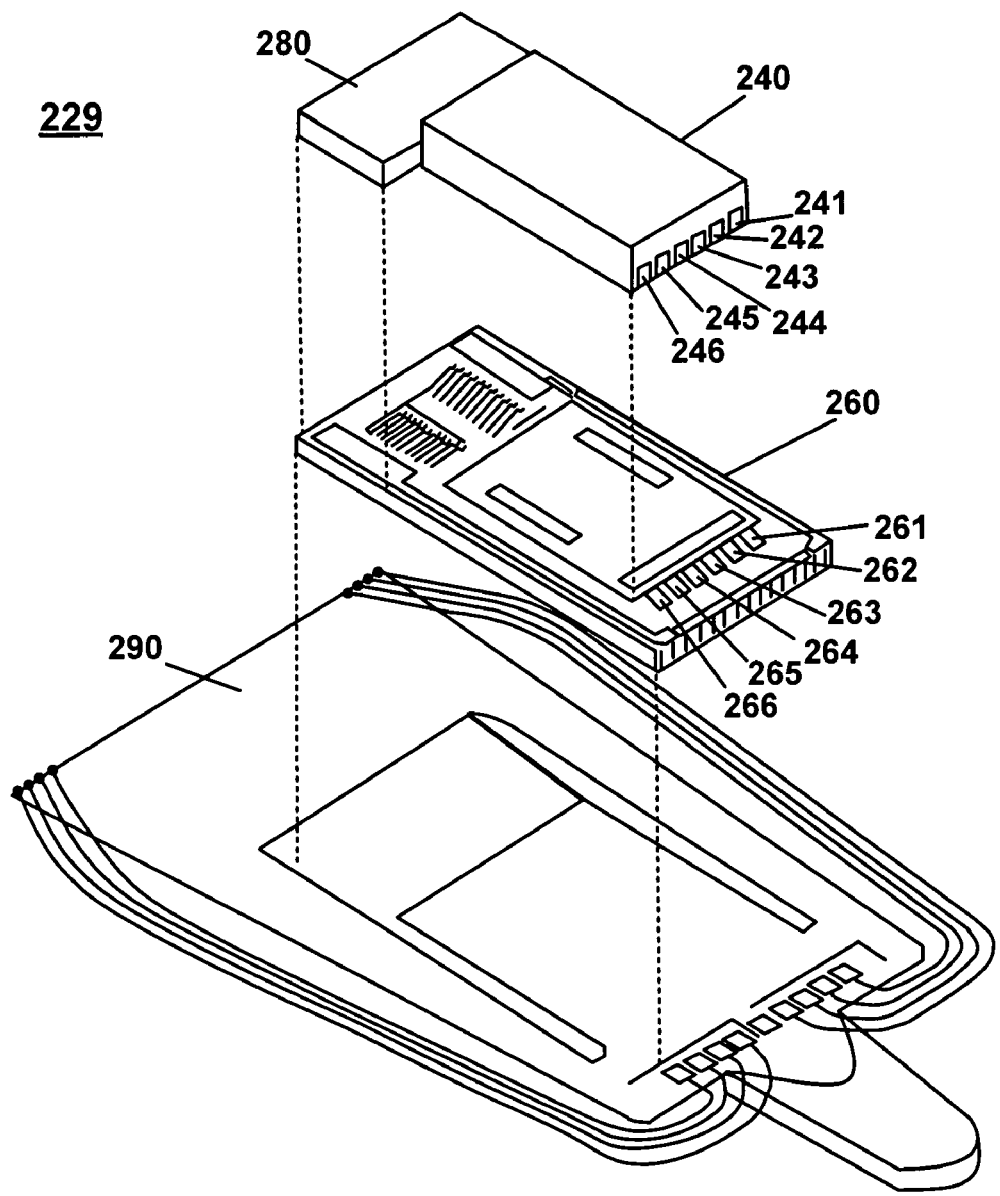
FIG. 2 is an inverted isometric view of the slider assembly of FIG. 1, in accordance with an embodiment of the present invention.

With reference to FIG. 2, detail 229 is the most distal end of the assembly comprising slider 129 of FIG. 1, including a read/write magnetic head 240, a PZT ceramic 280, a suspension 290 and a microactuator 260. When these components are coupled together as an assembly, they are known as a head gimbal assembly or HGA. When microactuator 260 is interposed between head 240 and suspension 290 it moves head 240 and PZT ceramic 280 with respect to suspension 290.

FIG. 2 is an inverted isometric view of an HGA 229, which is an assembly of slider 129 and an ELS 127 of FIG. 1. HGA 229 shown to include a piezoelectric type (PZT) ceramic 280, a read/write transducer (magnetic head) 240, a microactuator 260, and a suspension 290, each of which are intercommunicatively coupleable and within which microactuator 260 is interposed between magnetic head 240 and suspension 290. In the embodiment shown, microactuator 260 includes a plurality of component data interconnects or data transmission lines terminating in bonding pads 261, 262, 263, 264, 265 and 266, and magnetic head 240 includes a plurality of data transmission lines terminating in bonding pads 241, 242, 243, 244, 245 and 246. It is noted that each data communication line associated with each bonding pad 241-246 or 261-266 may terminate within and/or couple with another line within and/or provide an additional externally accessible communicative connection for the component in which it is disposed. It is further noted that bonding pad 261 of microactuator 260 is associated with bonding pad 241 of magnetic head 240; pad 262 is associated with pad 242, and so on.

Although six bonding pads are shown on microactuator 260 of FIG. 2, it is noted that microactuator 260 may be configured to have a greater or lesser number of bonding pads.

Although embodiments of the present invention are described in the context of a microactuator in an information storage system, it should be understood that embodiments may apply to devices utilizing an electrical interconnect that is subject to a solder reflow process performed thereon. For example, embodiments of the present invention may apply to rigid printed circuit boards. More specifically, embodiments of the present invention may be used in printed circuit boards that are used for high speed signal processing. Embodiments of the present invention are also suitable for use in flexing circuits, e.g., flexing circuits for digital cameras and digital camcorders. The signal traces may also be replaced with power traces according to one embodiment.

In the embodiment shown, suspension 290 includes a base-metal layer which can be comprised in part of stainless steel. Although stainless steel is stated herein as the base-metal layer, it is appreciated that a plurality of metals may be utilized as the base-metal layer of suspension 290.

BEST MODES FOR CARRYING OUT THE INVENTION

FIGS. 3A-3F are each a profile view of the orientation of solder pad 246 of component 240 relative to solder pad 266 of component 260 as shown in FIG. 2 and upon which embodiments of the present invention are directed.

In accordance with embodiments of the present invention, each of FIGS. 3A-3F includes a substrate 240 and associated solder pad 246, as described herein with reference to FIG. 2, and an electrical/communicative connection coupled therewith, e.g., trace 247. Each of FIGS. 3A-3F also includes a substrate 360, functionally analogous to substrate 260 of FIG. 2, having a trace 367 coupled to a solder pad, e.g., solder pad 366. Each solder pad 366 of FIGS. 3A-3F is shown configured with a solder pad barrier in accordance with embodiments of the present invention.

With reference to FIGS. 3A-3F, solder pad 366 is shown to have two analogously formed barriers, barrier 368 (shown) and barrier 369 (not visible in profile view). In an alternative embodiment of the present invention, barriers 368 and 369 may not be analogous. Although embodiments of the present invention are shown practiced upon substrate 360, is noted that embodiments of the present invention may be practiced on substrate 240. Additionally, embodiments of the present invention may be combinationally practiced on substrate 360 and substrate 240, e.g., a solder pad (not shown) having a barrier 368 and solder pad 366 having a barrier 369.

Figure 3A:
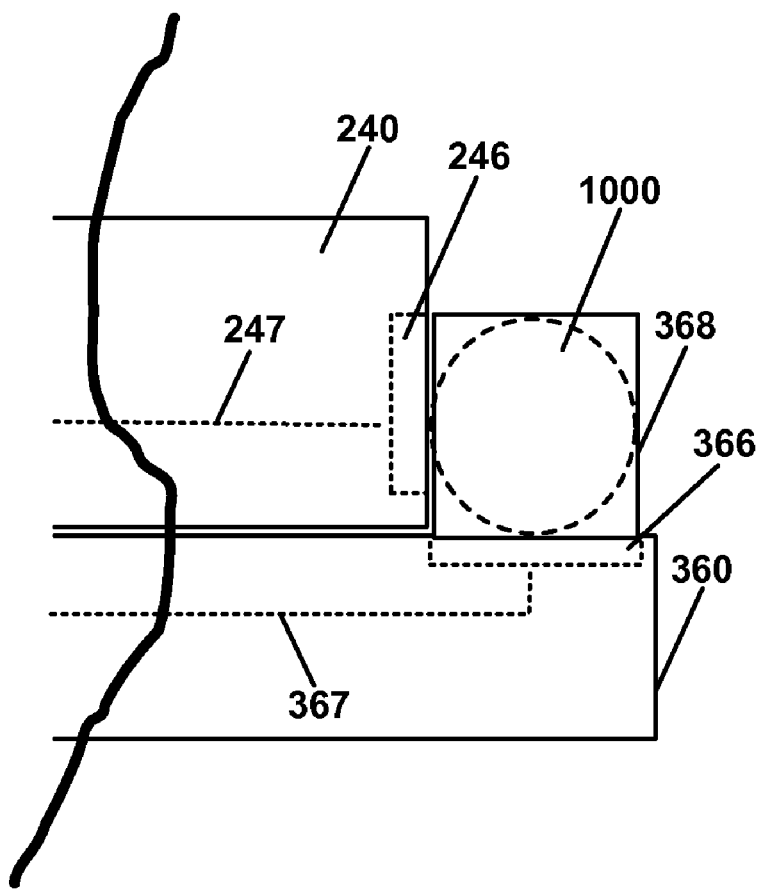
FIG. 3A is a profile view of a solder pad with barrier in an embodiment of the present invention.

In FIG. 3A, solder pad barrier 368 is depicted as rectangular in shape and of a size approximate to an un-flowed solder ball 1000, as indicated with a dashed line, in an embodiment of the present invention. In the present embodiment, solder pad barrier 368 and solder pad barrier 369 (not visible in FIG. 3A, shown in FIG. 4E) are formed upon solder pad 360 and extend upward from solder pad 360 and having a height approximating a solder ball 1000 diameter. In an embodiment, solder pad barrier 368 is formed proximal to a peripheral surface of solder pad 366 and solder pad barrier 369 is formed on an opposing peripheral surface are formed proximal to a peripheral edge of a solder pad, e.g., solder pad 366.

In the present embodiment, solder pad barriers 368 and 369 are oriented in parallel and perpendicular to the surface upon which each are formed. By virtue of the parallelism between barrier 368 and barrier 369, there is an inherent opening at each peripheral edge perpendicular to the peripheral edges upon which the barriers are formed. In the present embodiment, an open end of solder pad 366 with barriers 368/369 is oriented toward a solder pad of the component to which substrate 360 is to be communicatively coupled, e.g., solder pad 246 of substrate 240.

Figure 3B:
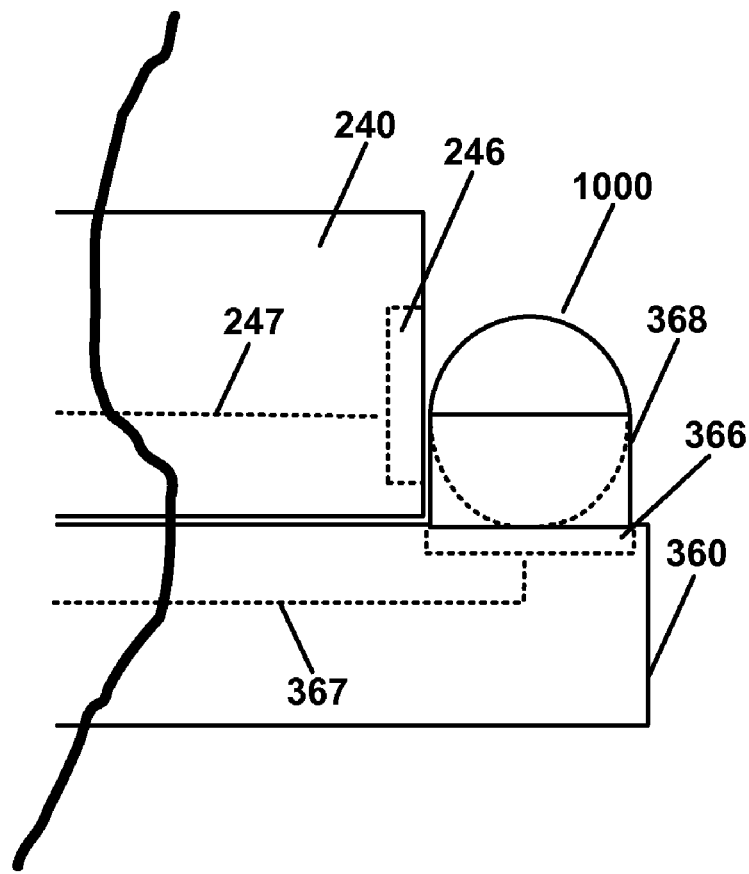
FIG. 3B is a profile view of a solder pad with barrier in another embodiment of the present invention.

In FIG. 3B, solder pad barrier 368 is depicted as rectangular in shape and of a size approximate to a radius of an un-flowed solder ball 1000, as indicated with a dashed line, in an embodiment of the present invention. In the present embodiment, solder pad barrier 368 and solder pad barrier 369 (not visible in FIG. 3A, shown in FIG. 4E) are formed upon solder pad 360 and extend upward from solder pad 360 and having a height approximating a solder ball 1000 diameter. In the present embodiment, solder pad barriers 368 and 369 are formed proximal to a peripheral edge of a solder pad, e.g., solder pad 366.

In the present embodiment, solder pad barriers 368 and 369 are oriented in parallel and perpendicular to the surface upon which each are formed. By virtue of the parallelism between barrier 368 and barrier 369, there is an inherent opening at each peripheral edge perpendicular to the peripheral edges upon which the barriers are formed. In the present embodiment, an open end of solder pad 366 with barriers 368/369 is oriented toward a solder pad of the component to which substrate 360 is to be communicatively coupled, e.g., solder pad 246 of substrate 240.

Figure 3C:
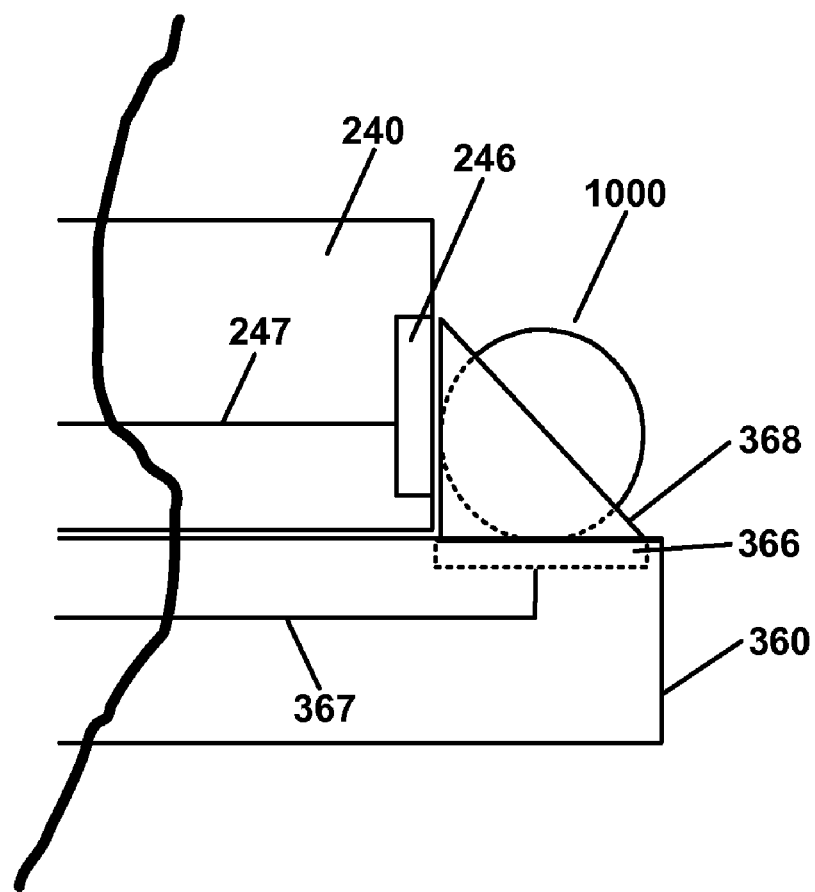
FIG. 3C is a profile view of a solder pad with barrier in yet another embodiment of the present invention.

In FIG. 3C, solder pad barrier 368 is depicted as triangular in shape and of a size compatible with an un-flowed solder ball 1000, in an embodiment of the present invention. In the present embodiment, solder pad barrier 368 and solder pad barrier 369 (not visible in FIG. 3A, shown in FIG. 4E) are formed upon solder pad 360 and extend upward from solder pad 360. In the present embodiment, solder pad barriers 368 and 369 are formed proximal to a peripheral edge of a solder pad, e.g., solder pad 366.

In the present embodiment, solder pad barriers 368 and 369 are oriented in parallel and perpendicular to the surface upon which each are formed. By virtue of the parallelism between barrier 368 and barrier 369, there is an inherent opening at each peripheral edge perpendicular to the peripheral edges upon which the barriers are formed. In the present embodiment, an open end of solder pad 366 with barriers 368/369 is oriented toward a solder pad of the component to which substrate 360 is to be communicatively coupled, e.g., solder pad 246 of substrate 240.

Figure 3D:
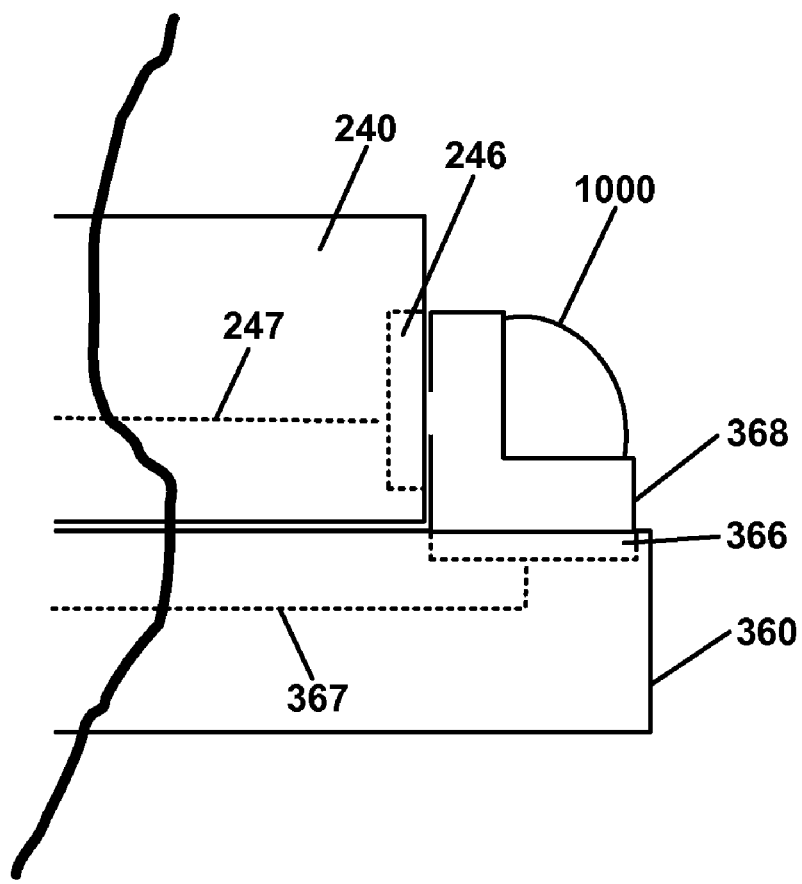
FIG. 3D is a profile view of a solder pad with barrier in yet still another embodiment of the present invention.

In FIG. 3D, solder pad barrier 368 is depicted as ell shaped, e.g., having an appearance of an 'L' in block form, and of a size compatible to an un-flowed solder ball 1000, in an embodiment of the present invention. In the present embodiment, solder pad barrier 368 and solder pad barrier 369 (not visible in FIG. 3A, shown in FIG. 4E) are formed upon solder pad 360 and extend upward from solder pad 360. In the present embodiment, solder pad barriers 368 and 369 are formed proximal to a peripheral edge of a solder pad, e.g., solder pad 366.

In the present embodiment, solder pad barriers 368 and 369 are oriented in parallel and perpendicular to the surface upon which each are formed. By virtue of the parallelism between barrier 368 and barrier 369, there is an inherent opening at each peripheral edge perpendicular to the peripheral edges upon which the barriers are formed. In the present embodiment, an open end of solder pad 366 with barriers 368/369 is oriented toward a solder pad of the component to which substrate 360 is to be communicatively coupled, e.g., solder pad 246 of substrate 240.

Figure 3E:
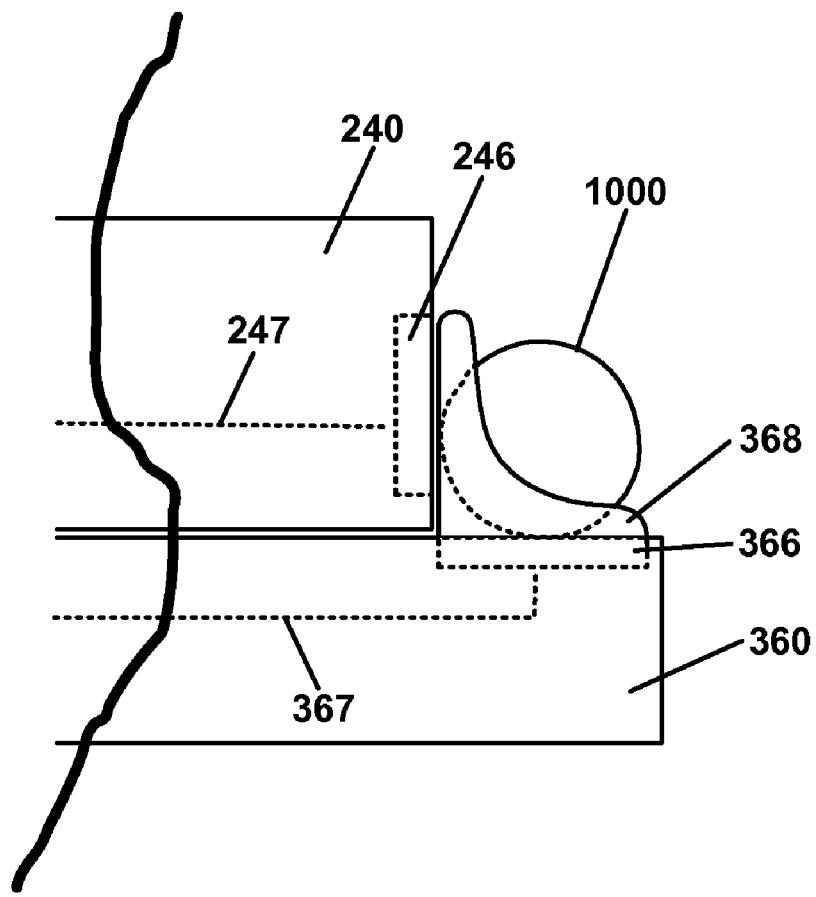
FIG. 3E is a profile view of a solder pad with barrier in an additional embodiment of the present invention.

In FIG. 3E, solder pad barrier 368 is depicted as a rounded ell shape, similar to solder pad barrier 368 of FIG. 3D, but with rounded corner portions, and of a size compatible to an un-flowed solder ball 1000, in an embodiment of the present invention. In the present embodiment, solder pad barrier 368 includes portions having right angles and portions having rounded surfaces. In the present embodiment, solder pad barrier 368 and solder pad barrier 369 (not visible in FIG. 3A, shown in FIG. 4E) are formed upon solder pad 360 and extend upward from solder pad 360. In the present embodiment, solder pad barriers 368 and 369 are formed proximal to a peripheral edge of a solder pad, e.g., solder pad 366.

In the present embodiment, solder pad barriers 368 and 369 are oriented in parallel and perpendicular to the surface upon which each are formed. By virtue of the parallelism between barrier 368 and barrier 369, there is an inherent opening at each peripheral edge perpendicular to the peripheral edges upon which the barriers are formed. In the present embodiment, an open end of solder pad 366 with barriers 368/369 is oriented toward a solder pad of the component to which substrate 360 is to be communicatively coupled, e.g., solder pad 246 of substrate 240.

Figure 3F:
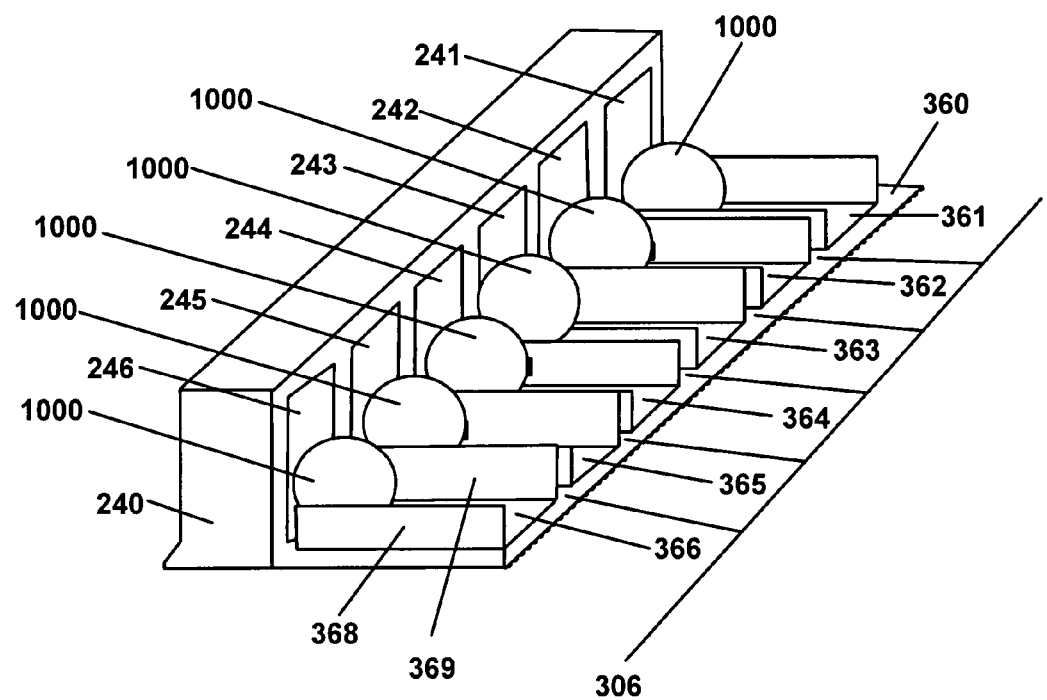
FIG. 3F is an angled view of solder pads with barriers in a component having integrated lead solder pads in an embodiment of the present invention.

FIG. 3F is an expanded front facing angled view of component 240 and component 360 of FIG. 2. Component 240 (as described herein with reference to FIG. 2) and component 360 (as described herein with reference to FIGS. 3A-3E, FIGS. 4A-4E and FIGS. 5A-5E) are subject to a solder process performed thereon to enable electrical and communicative coupling. Commonly, a solderable material, e.g., a solder ball 1000, is disposed upon the solder pad junction and upon which energy is applied to reflow the solderable material. Shown is a solder ball 100 disposed at each solder pad junction, e.g., solder pad 241 and solder pad 361, solder pad 241 and solder pad 362, etc.

In an embodiment of the present invention, solder pads of component 360, e.g., solder pads 361-366, are oriented proximal to associated solder pads 241-246 of component 240. In an embodiment of the present invention, each solder pad 361-366 is configured with a solder pad barrier 368 and 369, similar to that shown in FIGS. 3A and 3B and as described herein with reference to FIGS. 4A-4E and FIGS. 5A-5E.

Still referring to FIG. 3F, in an embodiment of the present invention, solder pads 361-366 are configured with analogous solder pad barriers 368 and 369. Alternatively, solder pads 361-366 may be configured with differing solder pad barriers, e.g., solder pad 366 having barriers 368 and 369, as shown in FIG. 3A, in combination with solder pad 365 having barriers 368 and 369, as shown in FIG. 3C, in combination with solder pad 364 having barriers 368 and 369, as shown in FIG. 3E, and so on.

FIG. 3F further includes a plurality of spaces, e.g., solder pad spaces 306, interposed between each solder pad of component 360, e.g., solder pads 361-366. Spaces 306 are provided for maintaining signal isolation, e.g., solder pad 366 is not coupled to solder pad 365. It is noted that embodiments of the present invention prevent solder from flowing into solder pad spaces 306 during a reflow process preformed on solder ball 1000, thus eliminating solder bridging. In an embodiment of the present invention, solder pad spaces 306 are analogous. Alternatively, solder pad spaces 306 may configured differently.

Figure 3G:
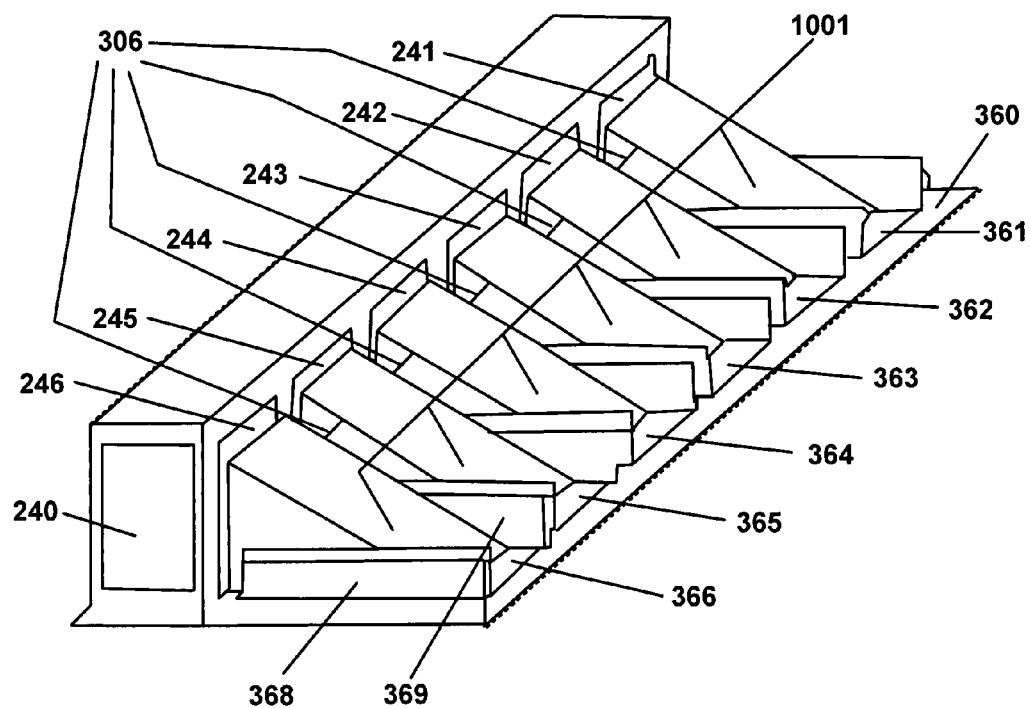
FIG. 3G is a sequential angled view of the solder pads of FIG. 3F subsequent to be subjected to a soldering process, in an embodiment of the present invention.

FIG. 3G is a sequential expanded front facing angled view of FIG. 3F, in accordance with an embodiment of the present invention. Shown are solder flow joints 1001 which are reflowed solder balls 1000 subsequent to being subjected to a solder reflow process performed thereon. By virtue of each solder pad 361-366 configured with a solder pad barrier 368 and a solder pad barrier 369, the integrity of each solder pad space 306 interposed between solder pads 361-366 is maintained, thus eliminating solder bridging.

FIGS. 4A, 4B, 4C, 4D and 4E are sequential block diagrams of a process 400 for the fabrication of a solder pad 366 with barriers 368 and 369 as shown in FIG. 3A, in an embodiment of the present invention.

Figure 4A:
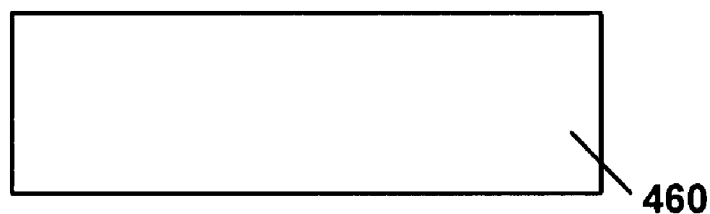
FIG. 4A is a sequential block diagram of a process for the fabrication of a solder pad with barrier in an embodiment of the present invention.

FIG. 4A is a block diagram of process 400 for fabricating an apparatus, e.g., component 260 of FIG. 2, in which an initial substrate 460 is fabricated. In the present embodiment, substrate 460 is fabricated from silicon. It is noted that nearly any substrate fabrication process may be utilized to fabricate substrate 460.

Figure 4B:
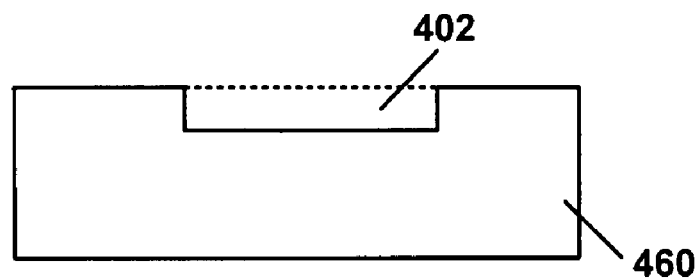
FIG. 4B is a sequential block diagram of the process for the fabrication of the solder pad with barrier of FIG. 4A.

FIG. 4B is a sequential block diagram of process 400 of FIG. 4A. Substrate 460 is shown to have had a subtractive process thereon, such that substrate 460 has a trough 402 formed therewithin, in an embodiment of the present invention. It is noted that nearly any substrate subtraction process may be utilized to fabricate trough 402 in substrate 460. Nearly any subtraction process including, but not limited to, etching can be utilized to create trough 402.

Figure 4C:
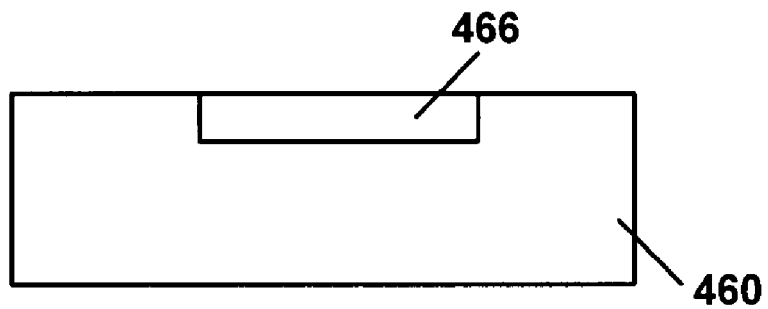
FIG. 4C is a sequential block diagram of a process for the fabrication of the solder pad with barrier of FIG. 4B.

FIG. 4C is a sequential block diagram of process 400 of FIG. 4B. Substrate 460 is shown to have fabricated within trough 402 a solder pad 466 via a deposition additive process. It is noted that nearly any deposition process may be utilized to fabricate solder pad 466. In the present embodiment, solder pad 466 is characteristically compatible to substrate 460.

Figure 4D:
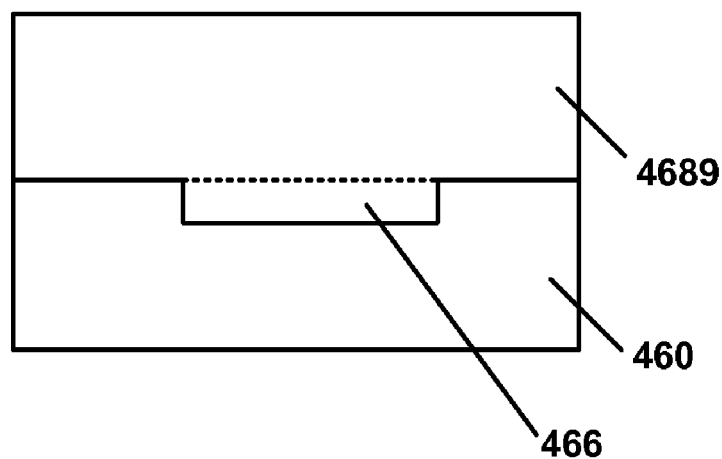
FIG. 4D is a sequential block diagram of a process for the fabrication of the solder pad with barrier of FIG. 4C.

FIG. 4D is a sequential block diagram of process 400 FIG. 4C. Substrate 460, having formed there within solder pad 466, is shown to have fabricated thereon another layer 4689 via a deposition process, and from which solder pad barriers 468 and 469 are fabricated. In the embodiment shown, layer 4689 is materially analogous to solder pad 466.

Figure 4E:
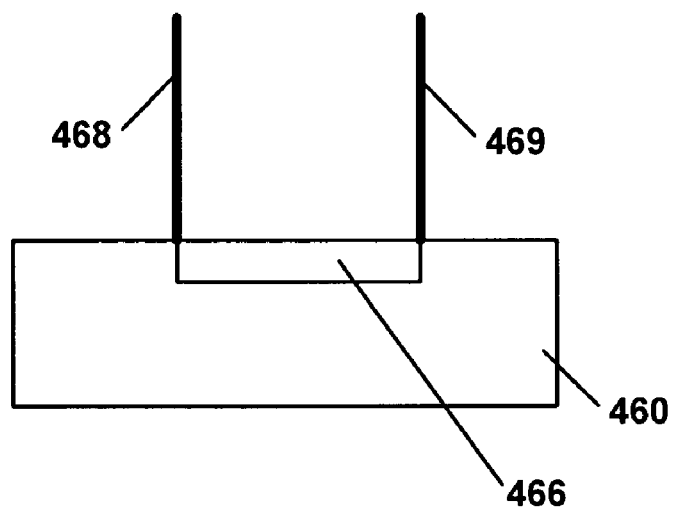
FIG. 4E is a sequential block diagram of a process for the fabrication of the solder pad with barrier of FIG. 4D.

FIG. 4E is a sequential block diagram of process 400 of FIG. 4D. Layer 4689 is shown to have had a subtractive process performed thereon such that solder pad barrier 468 and solder pad barrier 469 remain. It is noted that nearly any subtractive process may be performed to fabricate solder pad barriers 468 and 469. In accordance with an embodiment of the present invention, a solderable material, e.g., solder ball 1000, is interposed between solder pad barrier 468 and solder pad barrier 469 prior to a reflow process, e.g., as shown in FIG. 3F.

FIGS. 5A, 5B, 5C, 5D and 5E are sequential block diagrams of a process 500 for the fabrication of a solder pad 366 with barriers 368 and 369, in another embodiment of the present invention, as shown in FIGS. 3F and 3G.

Figure 5A:
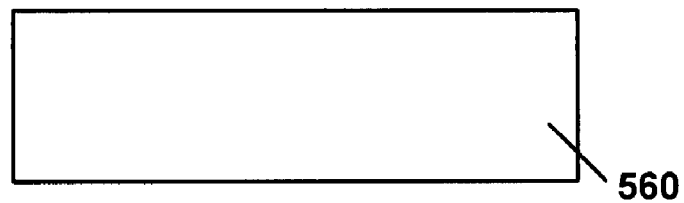
FIG. 5A is a sequential block diagram of a process for the fabrication of a solder pad with barrier in another embodiment of the present invention.

FIG. 5A is a block diagram of process 500 for fabricating a solder pad 566 in which an initial substrate 560 is fabricated. In the present embodiment, substrate 560 is fabricated from silicon. It is noted that nearly any substrate fabrication process may be utilized to fabricate substrate 560.

Figure 5B:
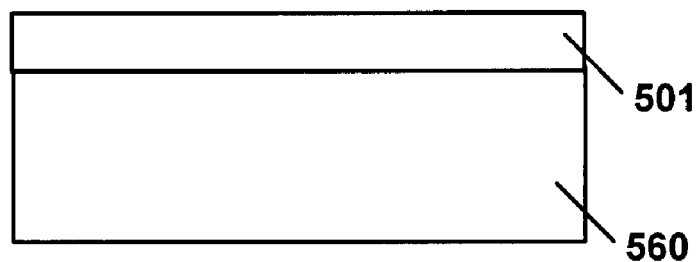
FIG. 5B is a sequential block diagram of the process for the fabrication of the solder pad with barrier of FIG. 5A

FIG. 5B is a sequential block diagram of process 500 of FIG. 5A. Substrate 560 is shown to have had an additive process performed thereon, such that that substrate 560 has a spacer layer 501 disposed above substrate 560. In the present embodiment, fabrication of spacer layer 501 utilizes material analogous to material used in substrate 560 fabrication, in an embodiment of the present invention. It is noted that nearly any additive process may be utilized to fabricate spacer layer 501 on substrate 560. In the present embodiment, spacer layer 501 is characteristically compatible to substrate 560.

Figure 5C:
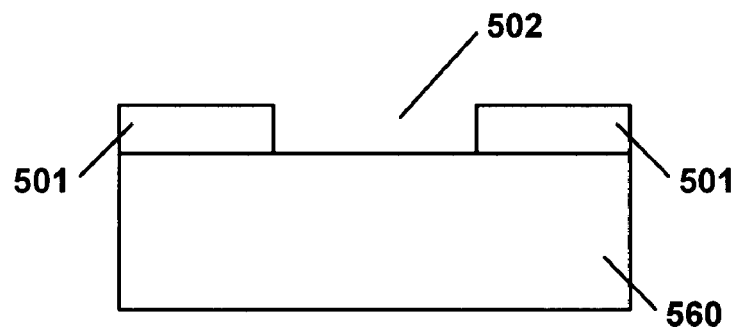
FIG. 5C is a sequential block diagram of the process for the fabrication of the solder pad with barrier of FIG. 5B.

FIG. 5C is a sequential block diagram of process 500 of FIG. 5B. Substrate 560, configured with spacer layer 501, is shown to have had performed thereon a subtractive process, resulting in a depression 502 remaining within spacer layer 501. It is noted that nearly any subtractive process may be utilized to fabricate depression 502.

Figure 5D:
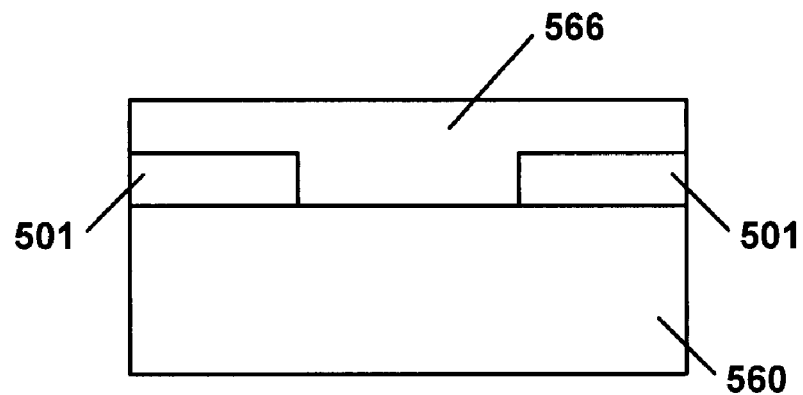
FIG. 5D is a sequential block diagram of a process for the fabrication of the solder pad with barrier of FIG. 5C.

FIG. 5D is sequential block diagram of process 500 of FIG. 5C. Substrate 560 with spacer layer 501 disposed thereon, is shown to have had an additive process formed thereon such that a solder pad layer 566 is disposed within depression 502 and upon spacer layer 501 of substrate 560. In an embodiment of the present invention, nearly any additive process may be used to deposit solder pad layer 566.

Figure 5E:
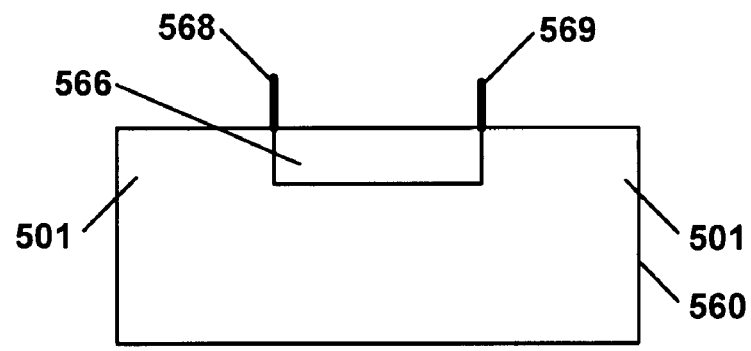
FIG. 5E is a sequential block diagram of a process for the fabrication of the solder pad with barrier of FIG. 5D.

FIG. 5E is a sequential block diagram of process 500 of FIG. 5D. Solder pad layer 566 is shown to have had a subtractive process performed thereon such that a solder pad 566 is fabricated having a solder pad barrier 568 and a solder pad barrier 569, in an embodiment of the present invention. In an embodiment, nearly any subtractive process may be implemented to fabricate solder pad barriers 568 and 569.

Figure 6:
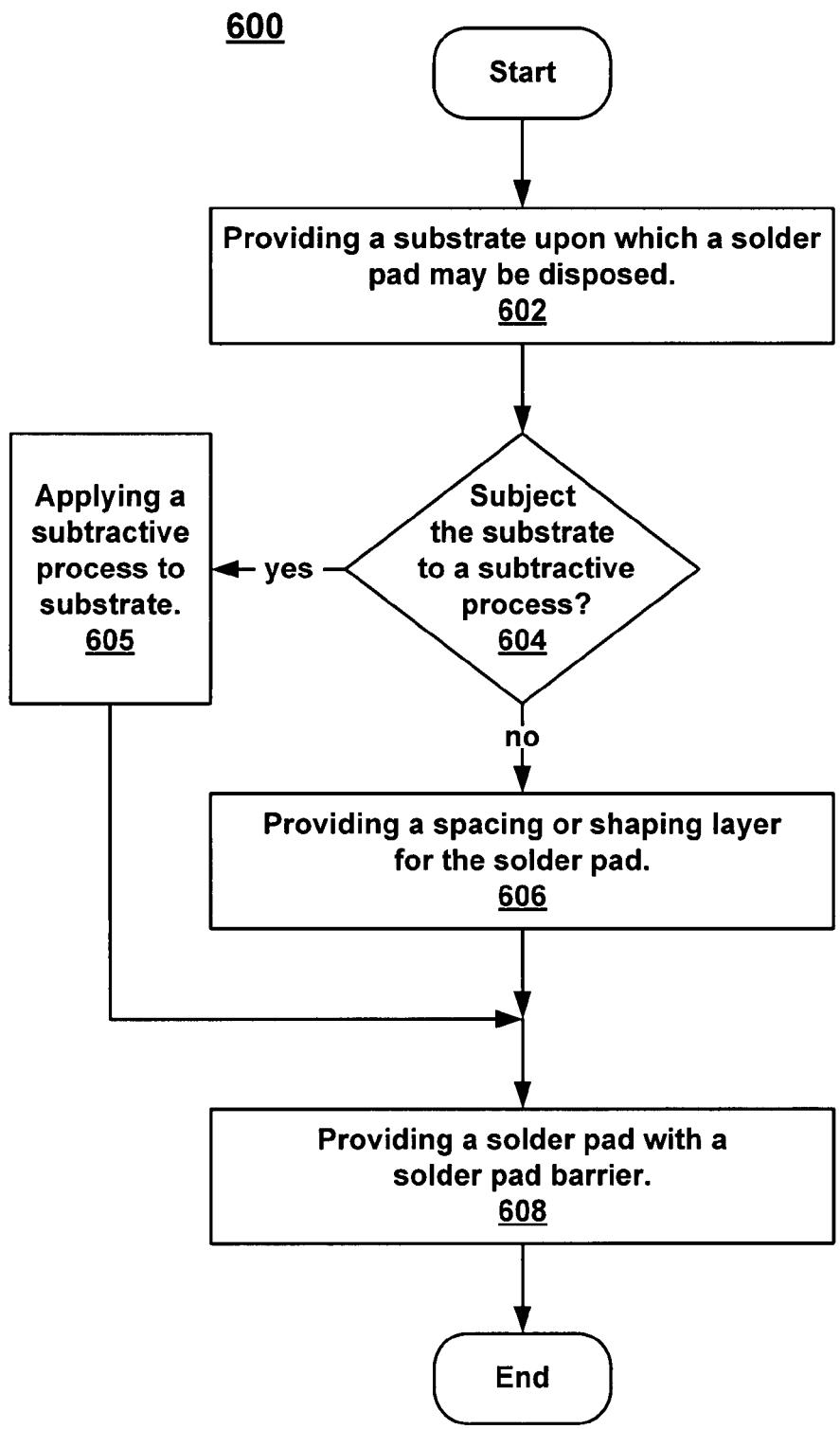
FIG. 6 is a flow chart illustrating steps of a fabrication process for a solder pad configured with a solder ball retainer in accordance with one embodiment of the present invention.

FIG. 6 is a flowchart of a process 600 for fabricating a solder pad with a solder pad barrier in an embodiment of the present invention. FIG. 6 is a flow chart of a process 600 in which particular steps are performed in accordance with an embodiment of the present invention for fabricating a solder pad having a solder pad barrier for disposition upon a substrate of a micro-electromechanical signal transmission line. Although specific steps are disclosed in process 600, such steps are exemplary. That is, the present invention is well suited to performing various other steps or variations or repetitions of the steps recited in FIG. 6. Within the present embodiment, it should be appreciated that the steps of process 600 may be performed by software, by hardware, by an assembly mechanism, through human interaction, or by any combination of software, hardware, assembly mechanism, and human interaction.

Process 600 will be described with reference to elements shown in FIGS. 3A-3G, FIGS. 4A-4E and FIGS. 5A-5E.

In step 602 of process 600, a suitable substrate, e.g., substrate 360, 460 or 560 of FIGS. 3A-3G, FIGS. 4A-4E and FIGS. 5A-5E, respectively, is introduced into process 600 in an embodiment of the present invention. A suitable substrate for a solder pad with a solder pad barrier in accordance with an embodiment of the present invention is typically silicon. Other substrates such as glass, quartz or ceramic may also be suitable for process 600.

In step 604 of process 600, the substrate may be subjected to a subtractive process. Accordingly, if the process necessitates a subtractive process, process 600 proceeds to step 605. Alternatively, if a subtractive process is not utilized, process 600 proceeds to step 606.

In step 605 of process 600, a substrate, e.g., substrate 460 of FIGS. 4A-4E, is subjected to a subtractive process, such that substrate 460 is ditched, creating a trough 402 (FIGS. 4B and 4C) therein, in an embodiment of the present invention. A typical subtractive process is by wet-etching that dissolves the metal, or ion-milling, which is a physical method of removing surface material by accelerated ions in low-pressure plasma, although alternative subtractive processes may be utilized.

In step 606 of process 600, a material, e.g., solder pad 466 of FIG. 4D or solder pad 566 of FIG. 5D, is deposited onto portions of a substrate e.g., substrates 460 and 560 of FIGS. 4D and 5D, respectively, in an embodiment of the present invention. In an embodiment, solder pads 466 and 566 are conductive, thus providing a signal conductor. In an embodiment, solder pad 466 and solder pad 566 are formed within the portion of a substrate upon which a subtractive process is performed, e.g., substrate 460 of FIG. 4B and within the depression 502 of spacer layer 501 of substrate 560 of FIGS. 5B-5D. Additionally, spacer layer 501 of FIGS. 5A-5E provides shaping for the bonding pad to be disposed thereon. A conductive material may comprise an adhesion layer such as chromium or titanium possibly followed by a layer of copper or gold. Common deposition technique for these materials is known in the industry as sputter deposition. Other deposition techniques may also be used such as chemical vapor deposition (CVD), electro-plating or evaporation. In another embodiment of the present invention electroless plating is used to apply a conductive material.

In step 608 of process 600, a solder pad configured with a barrier (e.g., solder pad 366 with solder pad barriers 368 and 369 of FIGS. 3A-3F, solder pad 466 with solder pad barriers 468 and 469 of FIG. 4E and solder pad 566 with solder ball barriers 568 and 569 of FIG. 5E, is formed from the material deposited in step 608 of process 600, e.g., solder pad 466 of FIG. 4D and solder pad 566 of FIG. 5D. In an embodiment, a subtractive process is performed on solder pad 466 of FIG. 4D and solder pad 566 of FIG. 5D such that a solder pad 466 with a solder pad barrier 468 and 469 and a solder pad 566 with a solder pad barrier 568 and a solder pad barrier 569 are fabricated, respectively, in an embodiment of the present invention, thereby creating a solder pad for preventing solder bridging that may occur during a solder reflow process.

Examples of solder reflow techniques can include, but is not limited to, placing a solder preform, such as a solder ball, upon solder pad 366 and between solder pad barrier 368 and solder pad barrier 369, as shown in FIGS. 3A-3F, followed with the application of an energy source for solder reflowing. Energy source can be, but is not limited to, a laser, a focused infrared light, an oven, and the like. Alternatively, tinning, which is the technique of applying a film of solder on a surface is varied and well known in the art may be implemented.

The present invention, in the various presented embodiments allows for the fabrication of a solder pad for preventing solder bridging when the solder pad is subjected to a solder reflow process, such that instances of solder bridging are eliminated. By virtue of a solder pad with a barrier, reductions in instances of cross-wiring, overflow, and other improper reflowing of the solder are also realized.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments described herein were chosen and described in order to best explain the principles of the invention and its practical application, to thereby enable others skilled in the art to best utilize the invention and various embodiments with various modifications. as are suited to the particular use contemplated. It is intended that the scope of the invention be defined by the Claims appended hereto and their equivalents.

What is claimed is:

1. An electronic component having a solder pad configured for eliminating instances of solder bridging during a reflow process, said electronic component comprising:
   a substrate upon which said solder pad is disposed;
   a signal conductive layer coupled with said substrate, said signal conductive layer comprising:
      a solder pad portion having a base surface;
      said base surface planar to a surface of said substrate; and
      at least two barrier portions extruding upwardly from said base surface of said solder pad portion, said barrier portion for preventing solder bridging during a reflow process performed on a solder ball disposed in said barrier portion wherein said at least two barrier portions are disposed on opposite sides of said solder ball and are not connected to each other.

2. The electronic component of claim 1 wherein said substrate further comprises a depression formed therein, said depression forming a peripheral edge of said base surface of said solder pad portion.

3. The electronic component of claim 2 wherein said solder pad portion is formed within said depression.

4. The electronic component of claim 3 wherein a barrier portion of said at least two barrier portions is disposed above said solder pad portion.

5. The electronic component of claim 1 wherein said at least two barrier portions comprise a first barrier portion and another barrier portion, said first barrier portion disposed proximal to a periphery of said base surface and wherein said another barrier portion is disposed proximal to an opposing periphery, said opposing periphery parallel with said periphery.

6. The electronic component of claim 5 wherein said first barrier portion and said another barrier portion are perpendicular to said planar surface of said base surface.

7. The electronic component as recited in claim 5 wherein said first barrier portion and said another barrier portion are analogous.

8. A hard disk drive comprising:
a housing;
a disk pack mounted to the housing and having at least one disk that is rotatable relative to the housing, the disk pack defining an axis of rotation and a radial direction relative to the axis, and the disk pack having a downstream side wherein air flows away from the at least one disk, and an upstream side wherein air flows toward the disk pack;
an actuator mounted to the housing and being movable relative to the disk pack, the actuator having one or more heads for reading data from and writing data to the at least one disk of the disk pack; and
an electrical lead suspension (ELS), said ELS having a microactuator, said microactuator having a solder pad configured to prevent solder bridging, said microactuator comprising:
a substrate layer upon which said solder pad is disposed; and
a signal conductive layer above said substrate layer, said signal conductive layer comprising:
a solder pad portion having a base surface; and
at least two barrier portions above said base surface, said at least two barrier portions each disposed within a peripheral edge of said base surface, said at least two barrier portions for eliminating solder bridging during a reflow process performed on a solder ball, wherein said at least two barrier portions are disposed on opposite sides of said solder ball and are not connected to each other.

9. The hard disk drive of claim 8 wherein said substrate layer further comprises a trough formed therein via a subtractive process, said subtractive process performed within an internal portion of a peripheral edge of said substrate layer so as to form a periphery of said base surface of said solder pad portion.

10. The hard disk drive of claim 9 wherein said base surface of said solder pad portion is disposed within said trough.

11. The hard disk drive of claim 10 wherein said at least two barrier portions are each is disposed above said base surface of said solder pad portion.

12. The hard disk drive as recited in claim 8 wherein one of said at least two barrier portions is formed proximal to a periphery of said base surface.

13. The hard disk drive as recited in claim 12 wherein one of said at least two barrier portions is formed proximal to an opposing periphery of said base surface, said opposing periphery parallel with said periphery.

14. The hard disk drive of claim 13 wherein said at least two barrier portions are analogous.

* * * * *

UNITED STATES PATENT AND TRADEMARK OFFICE
CERTIFICATE OF CORRECTION

PATENT NO.         : 8,213,121 B2
APPLICATION NO.    : 11/973668
DATED              : July 3, 2012
INVENTOR(S)        : Melvin J. A. Dela Pena et al.

Page 1 of 1

It is certified that error appears in the above-identified patent and that said Letters Patent is hereby corrected as shown below:

Column 12, Claim 11, Line 21: Delete, "barrier portions are each is disposed above said base surface"
Insert, --barrier portions are each disposed above said base surface--

Signed and Sealed this
Twenty-sixth Day of February, 2013

Teresa Stanek Rea
*Acting Director of the United States Patent and Trademark Office*